(12) United States Patent
Lin et al.

(10) Patent No.: US 8,138,494 B2
(45) Date of Patent: Mar. 20, 2012

(54) GAN SERIES LIGHT-EMITTING DIODE STRUCTURE

(75) Inventors: Ray-Ming Lin, Taipei County (TW); Jhong-Hao Jiang, Taoyuan County (TW); Bor-Ren Fang, Taipei (TW)

(73) Assignee: Chang Gung University, Taoyuan County (TW)

( * ) Notice: Subject to any disclaimer, the term of this patent is extended or adjusted under 35 U.S.C. 154(b) by 271 days.

(21) Appl. No.: 12/694,600

(22) Filed: Jan. 27, 2010

(65) Prior Publication Data
US 2011/0180778 A1 Jul. 28, 2011

(51) Int. Cl.
*H01L 33/00* (2010.01)
(52) U.S. Cl. ...... 257/14; 257/15; 257/103; 257/E33.034

(58) Field of Classification Search ............. 257/14, 257/15, 103, E33.034
See application file for complete search history.

(56) References Cited

U.S. PATENT DOCUMENTS
2011/0303891 A1* 12/2011 Chua et al. .......... 257/13
* cited by examiner

*Primary Examiner* — Minh-Loan T Tran

(57) ABSTRACT

The present invention relates to a GaN series light-emitting diode structure, which includes a substrate; at least one GaN series layer formed over the substrate; subsequently an interface blocking structure composed of an n-type GaN series superlattice structure and a GaN series light-emitting layer, and a GaN series light-emitting layer are formed over the GaN series layer; and a p-type GaN series layer formed over the GaN series light-emitting layer. In the present invention, the radiative recombination efficiency is improved by introducing an interface blocking structure before the light-emitting layer under the epitaxial conditions of low temperature and pure nitrogen atmosphere.

14 Claims, 9 Drawing Sheets

GAN SERIES LIGHT-EMITTING DIODE STRUCTURE

BACKGROUND OF THE INVENTION

1. Field of Invention

The present invention relates to a technical field of GaN series light-emitting diode (LED) structure, more specifically to a GaN series high light-emitting efficiency LED structure with an interface blocking layer structure formed under the light-emitting layer.

2. Description of the Related Art

As shown in FIG. 1, the structure of GaN series LED includes a sapphire substrate 10, a GaN buffer layer 11, an n-type doping GaN ohmic contact layer 12, an indium gallium nitride (InGaN) light-emitting layer 13, and a p-type doping GaN layer 14. Then, through photolithography and etching processes, the n-type doping GaN ohmic contact layer 12, the InGaN light-emitting layer 13 and the p-type doping GaN layer 14 are partially removed to expose a partial surface of the n-type doping GaN ohmic contact layer 12. In addition, a transparent conductive layer 15 is formed over the p-type doping GaN layer 14; a p-type metal electrode 16 is disposed over the transparent conductive layer 15; and an n-type metal electrode 17 is disposed on the surface of the n-type doping GaN ohmic contact layer 12. Thus, the so-called conventional lateral electrode structure of the GaN series LED is formed.

Referring now to FIG. 2, the structural schematic view includes a sapphire substrate 20, a GaN buffer layer 21, an n-type doping GaN ohmic contact layer 22, an n-type doping aluminum indium gallium nitride superlattice stacked structure 23, an InGaN light-emitting layer 24, a p-type doping GaN layer 25, a transparent conductive layer 26, a p-type metal electrode 27, and an n-type metal electrode 28. Wherein, the n-type doping aluminum indium gallium nitride superlattice stacked structure 23 is composed of a number of aluminum indium gallium nitride layers with different thicknesses and composition, and the thickness difference is less than or equal to 50 Å.

Moreover, referring now to FIG. 3, it is a structural schematic view showing another GaN series LED disclosed by a prior art for improving light-emitting efficiency. The GaN series LED element includes an InGaN multiple quantum well (MQW) light-emitting layer 200 with periodic thickness variance, which is formed over an n-type doping GaN layer 100. The n-type doping GaN layer 100 is composed of an n-type doping GaN layer 100a with a growth temperature ranging from 1000 to 1050° C., and an n-type doping GaN layer 100b with a relative growth temperature ranging from 880 to 920° C.; the MQW light-emitting layer 200 produces periodic thickness variance because the added n-type doping GaN layer 100b grows in low temperature, and the preferred thickness of the n-type doping GaN layer 100b is about 1000 Å. However, the light-emitting efficiency of the conventional LED is still limited, and there is a need for further improvement.

SUMMARY OF THE INVENTION

The main object of the present invention is to provide a GaN series high light-emitting efficiency LED structure, wherein the GaN series LED structure includes an interface blocking layer to effectively reduce density of the non-radiative recombination center, and to further improve the light-emitting efficiency.

The present invention further improves the internal quantum efficiency through the n-type doping superlattice structure and the n-type doping GaN layer which block the non-radiative recombination.

In the present invention, by way of lowering temperature and adjusting the environment of the epitaxy reaction chamber, epitaxy grows in the interface blocking structure and the light-emitting layer under pure nitrogen and low temperature, so as to improve the efficiency of radiative recombination.

In addition, the present invention mainly provides a GaN series LED structure, including a substrate, at least one GaN series layer, a light-emitting layer, a p-type GaN series layer, and at least one interface blocking layer. Wherein, the GaN series layer is formed over the substrate; the light-emitting layer is formed over the GaN series layer; the p-type GaN series layer is formed over the light-emitting layer; and the interface blocking layer is formed between the GaN series layer and the light-emitting layer.

In which, the interface blocking layer is composed of an n-type GaN series superlattice structure stacked with an n-type GaN layer.

In which, the epitaxy growth temperature of the interface blocking layer ranges from 835° C. to 950° C.

In which, the thickness of the n-type GaN layer in the combination of the interface blocking layer is less than 1400 Å.

In which, the n-type GaN series superlattice structure in the combination of the interface blocking layer is composed of an aluminum indium gallium nitride layer mutually stacked with a GaN layer.

In which, the preferred range of the thickness of the n-type GaN layer is between 300 Å~1400 Å.

In which, the preferred range of the thickness of the n-type GaN series superlattice structure is between 600 Å~800 Å.

In which, the composition proportion of aluminum in the aluminum indium gallium nitride layer of the n-type GaN series superlattice structure ranges from 5% to 10%.

In which, the n-type GaN series superlattice structure further includes an InGaN layer subsequently and mutually stacked with the GaN layer.

In which, the composition proportion of indium in the InGaN layer is less than 10%, and the thickness of the InGaN layer is no more than 15 Å.

In addition, the present invention provides a GaN series LED structure, including a substrate, a GaN series buffer layer, a first n-type GaN series superlattice structure layer, a first n-type GaN series layer, a second n-type GaN series superlattice structure layer, a third n-type GaN series layer, a light-emitting layer, and a p-type GaN series layer. In which, the GaN series buffer layer is formed over the substrate; the first n-type GaN series superlattice structure layer is formed over the GaN series buffer layer; the first n-type GaN series layer is formed over the first n-type GaN series superlattice structure layer; the second n-type GaN series superlattice structure layer is formed over the first n-type GaN series layer; the third n-type GaN series layer is formed over the second n-type GaN series superlattice structure layer; the light-emitting layer is formed over the third n-type GaN series layer; and the p-type GaN series layer is formed over the light-emitting layer.

In which, an interface blocking layer is composed of the second n-type GaN series superlattice structure stacked with the third n-type GaN layer.

In which, the p-type GaN series layer is composed of a p-type cladding layer and a p-type ohmic contact layer.

In which, the p-type cladding layer is a superlattice structure composed of a p-type GaN series layer.

DETAILED DESCRIPTION OF THE INVENTION

Figure 1:
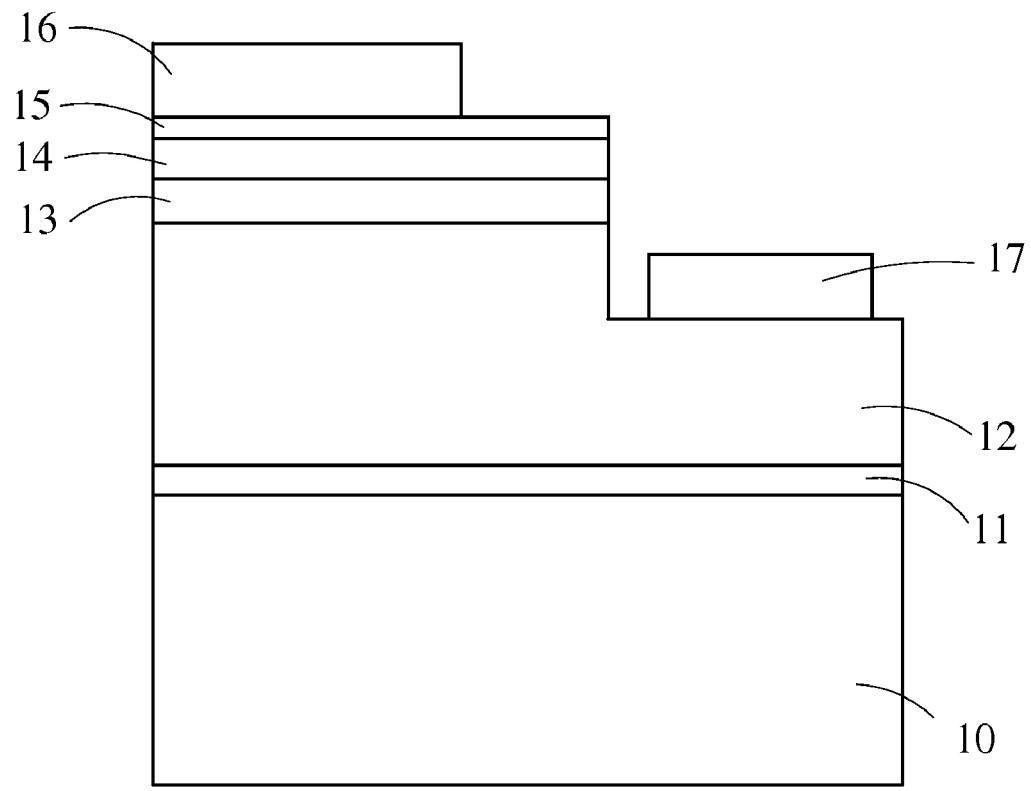
FIG. 1 is a schematic view of a LED structure in prior art.
Figure 2:
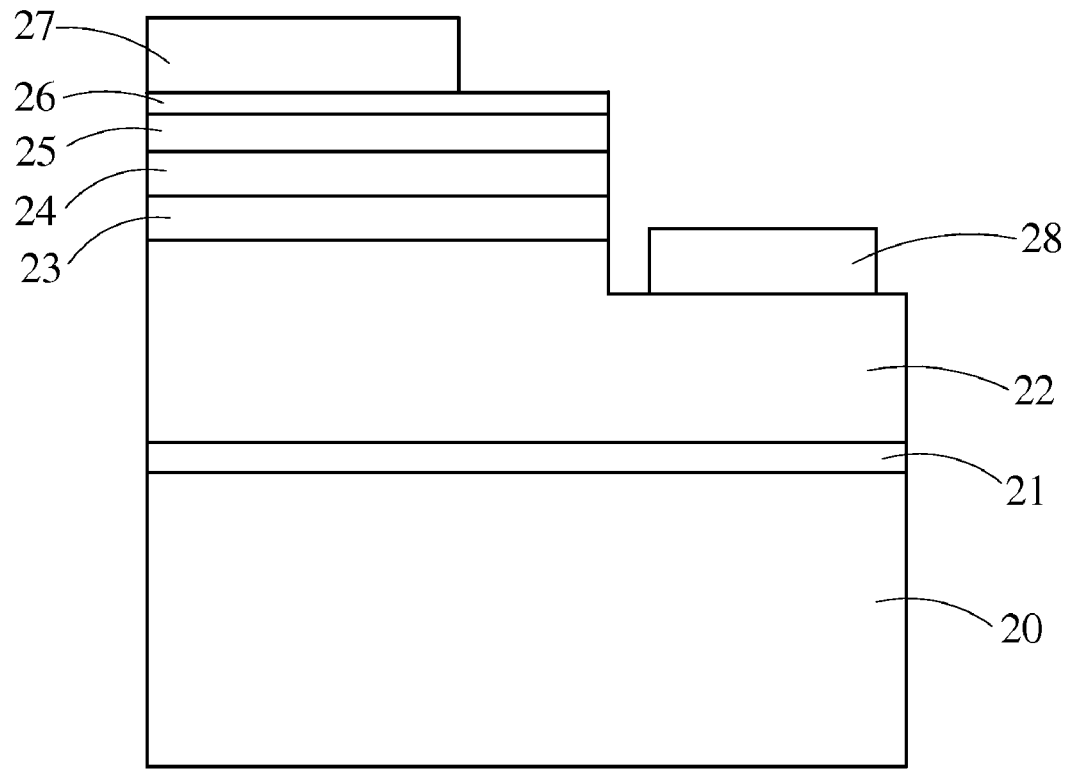
FIG. 2 is a schematic view of another LED structure in prior art.
Figure 3:
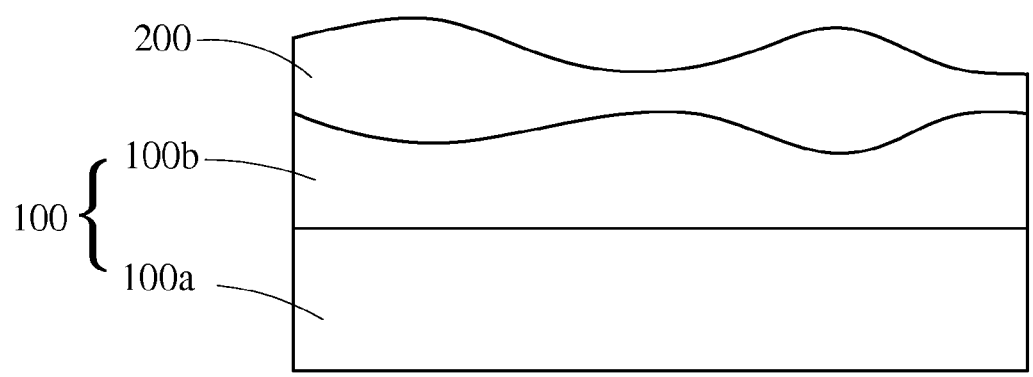
FIG. 3 is a schematic view of another LED structure in prior art.
Figure 4:
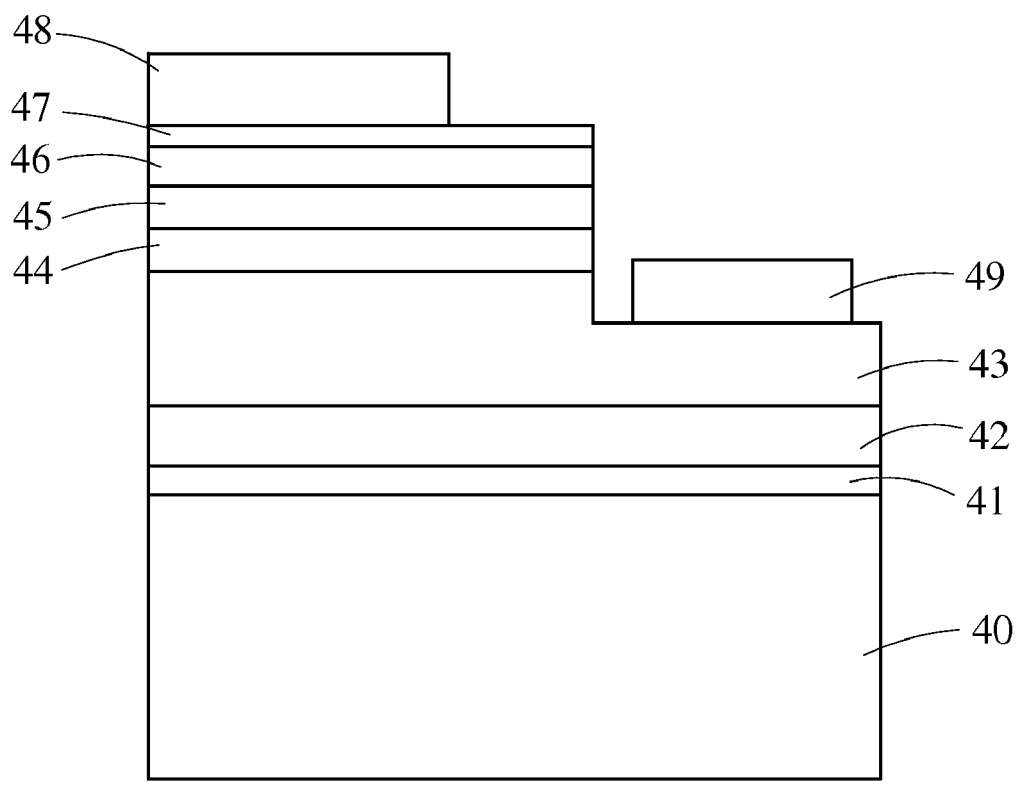
FIG. 4 is a structural schematic view of a preferred reference case of the LED, according to the present invention.

Referring now to FIGS. 4 to 9, the present invention provides a GaN series LED structure. First, referring to FIG. 4, it is a cross-section schematic view of a preferred reference case of the LED structure according to the present invention. The LED structure is mainly composed of a substrate 40, a low temperature GaN buffer layer 41, a non-doped type high temperature GaN layer 42, an n-type doping high temperature GaN ohmic contact layer 43, a light-emitting layer 44, a p-type doping aluminum gallium nitride cladding layer 45, and a p-type doping GaN ohmic contact layer 46. In which, the material of the substrate 40 is chosen from one of the following, including sapphire, carborundum, zinc oxide, zirconium diboride, spinel, lithium galliate, lithium aluminate, gallium trioxide, or silicon materials. First, after a low temperature GaN buffer layer 41 with a thickness of about 250 Å and a non-doped type high temperature GaN layer 42 with a thickness of about 1.2 µm are formed over the substrate 40 through the MOCVD method, epitaxy sequentially forms the GaN ohmic contact layer 43 over the GaN layer 42. Wherein, the n-type carrier doping concentration and growth thickness of the GaN ohmic contact layer 43 are about $4\times10^{+18}$ cm$^{-3}$ and 4 µm, respectively. Then, the MQW light-emitting layer 44 is composed of an InGaN quantum well without carrier doping and with a thickness of about 25 Å, and a GaN barrier layer with a thickness of about 125 Å. After the growth of the epitaxy of the light-emitting layer 44 is achieved, a cladding layer 45 composed of aluminum gallium nitride with a thickness of about 400 Å and a p-type carrier doping concentration of about $8\times10^{+19}$ cm$^{-3}$, and a p-type GaN ohmic contact layer 46 with a thickness of about 2500 Å and carrier doping concentration of about $1\times10^{+20}$ cm$^{-3}$ are grown. After the growth of epitaxy of the whole LED is achieved, a partial surface of the n-type GaN ohmic contact layer, a portion of the light-emitting layer, and a portion of the p-type aluminum gallium nitride cladding layer and the GaN ohmic contact layer are etched and removed through the conventional lateral electrode dice process method. A transparent conductive layer 47 is deposited over the p-type GaN ohmic contact layer, and a p-type metal electrode 48 and an n-type metal electrode 49 are made. After the dice process is finished, the substrate 40 is ground to have a thickness of about 90 um, and is made as an LED dice with a dimension of 325 um×325 um through the conventional laser cutting process and splitting methods. After the LED dice process is finished, the dice is fixed on the TO-can, and the p-type and n-type metal electrodes are connected with the electrodes on the TO-can by golden threads, then the dice is put into an integrating sphere to be driven by DC 20 mA, so as to get an EL intensity of about $4.5\times10^{-7}$, which is equivalent to an output power of about 4.2 mW.

Figure 5:
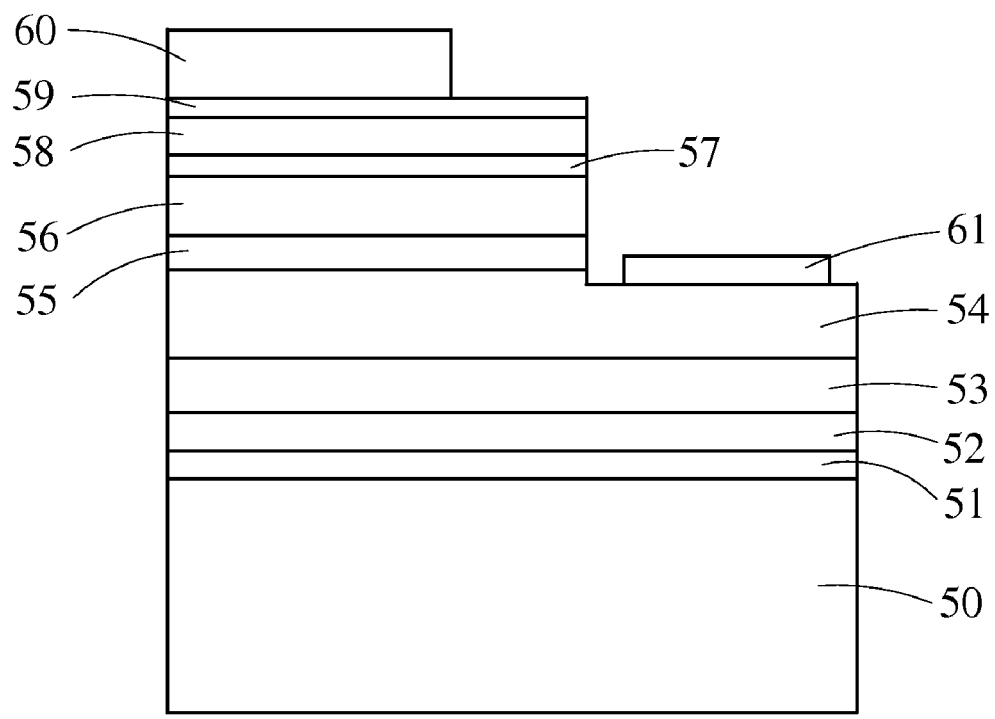
FIG. 5 is a structural schematic view of an embodiment of the LED according to the present invention.

Referring now to FIG. 5, a cross-section schematic view of a preferred embodiment of the LED structure is shown according to the present invention. The LED structure is mainly composed of a substrate 50, a low temperature GaN buffer layer 51, a non-doped type high temperature GaN layer 52, a superlattice structure layer 53 composed of an n-type doping high temperature GaN and aluminum gallium nitride, an n-type doping GaN ohmic contact layer 54, an n-type doping GaN and aluminum gallium nitride superlattice structure layer 55, a light-emitting layer 56, a p-type doping aluminum gallium nitride cladding layer 57, a p-type doping GaN ohmic contact layer 58, a transparent conductive layer 59, a p-type metal electrode 60, and an n-type metal electrode 61. First, after the low temperature GaN buffer layer 51 with a thickness of about 250 Å and the non-doped type high temperature GaN layer 52 with a thickness of about 1.2 µm are formed over the substrate 50 through the MOCVD method, epitaxy sequentially forms the superlattice structure layer 53 over the GaN layer 52, wherein the superlattice structure layer 53 is composed of a high temperature GaN with an n-type carrier doping concentration of about $6\times10^{+18}$ cm$^{-3}$ and aluminum gallium nitride, then each of the above respectively with a thickness of 20 Å repeats 15 times of overtapping growth, and epitaxy forms the n-type GaN ohmic contact layer 54 over the superlattice structure layer 53, in which the growth thickness and the n-type carrier doping concentration of the n-type GaN ohmic contact layer 54 are about 4 µm and $4\times10^{+18}$ cm$^{-3}$, respectively. Then, epitaxy repeatedly grows a superlattice structure layer 53, which is changed to have an n-type carrier doping concentration of about $1\times10^{+18}$ cm$^{-3}$ to form another superlattice structure layer 55. Then, the MQW light-emitting layer 56 is composed of an InGaN quantum well without carrier doping and with a thickness of about 25 Å, and a GaN barrier layer with a thickness of about 125 Å. After the growth of the epitaxy of the light-emitting layer is achieved, the p-type aluminum gallium nitride cladding layer 57 with a carrier doping concentration of about $8\times10^{+19}$ cm$^{-3}$ and a thickness of about 400 Å is grown. Finally, the p-type GaN ohmic contact layer 58 with a thickness of about 2500 Å and a carrier doping concentration of about $1\times10^{+20}$ cm$^{-3}$ is formed. Based on the dice process method disclosed by the above preferred reference case, an LED dice with a dimension of 325 um×325 um is made, and is applied with DC 20 mA, so as to get an EL intensity of about $4.9\times10^{-7}$, which is equivalent to an output power of about 4.65 mW with a 10% increase.

Figure 6:
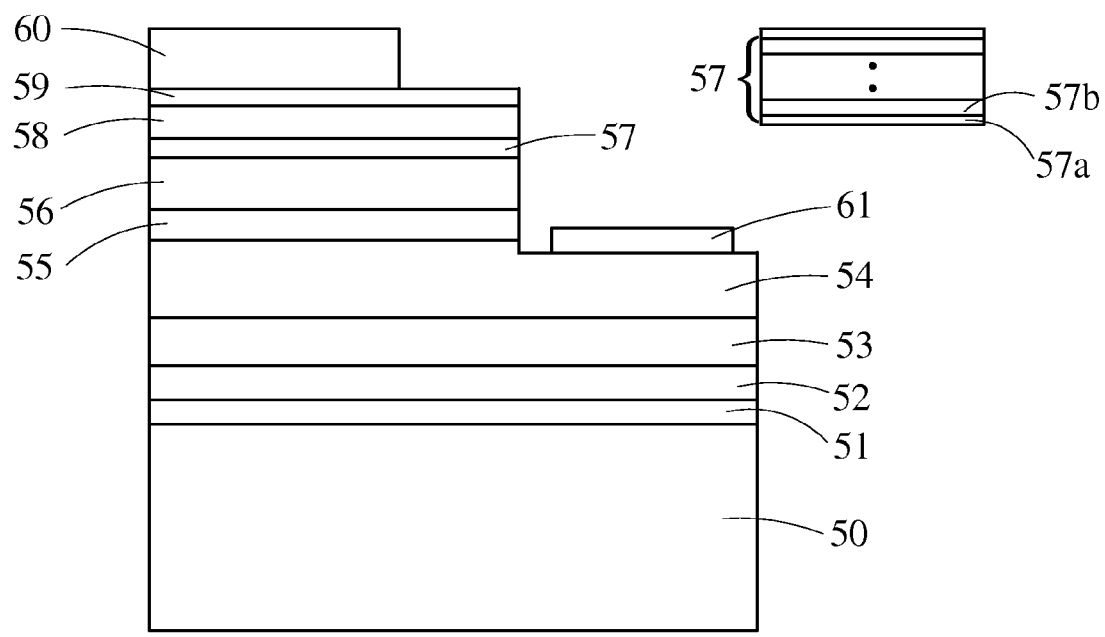
FIG. 6 is a structural schematic view of another embodiment of the LED according to the present invention.

Referring now to FIG. 6, a cross-section schematic view of another preferred embodiment of an LED structure according to the present invention is shown. The LED structure mainly depends on the embodiment shown in FIG. 5, but adopts a p-type superlattice structure, which is composed of a p-type doping aluminum gallium nitride layer 57a with a thickness of about 20 Å and a p-type doping GaN layer 57b with a thickness of about 20 Å by repeating 20 times of overtapping growth, in replacement of the p-type doping aluminum gallium nitride cladding layer 57. In addition, the epitaxy growth temperature, thickness, and carrier doping concentration of the structure maintains the same. Based on the above preferred reference case, the LED dice with a dimension of 325 um×325 um is made and is applied with DC 20 mA, so as to get an EL intensity of about $5.83\times10^{-7}$, which is equivalent to an output power of about 5.45 mW with a 30% increase compared with the embodiment shown in FIG. 4.

Figure 7:
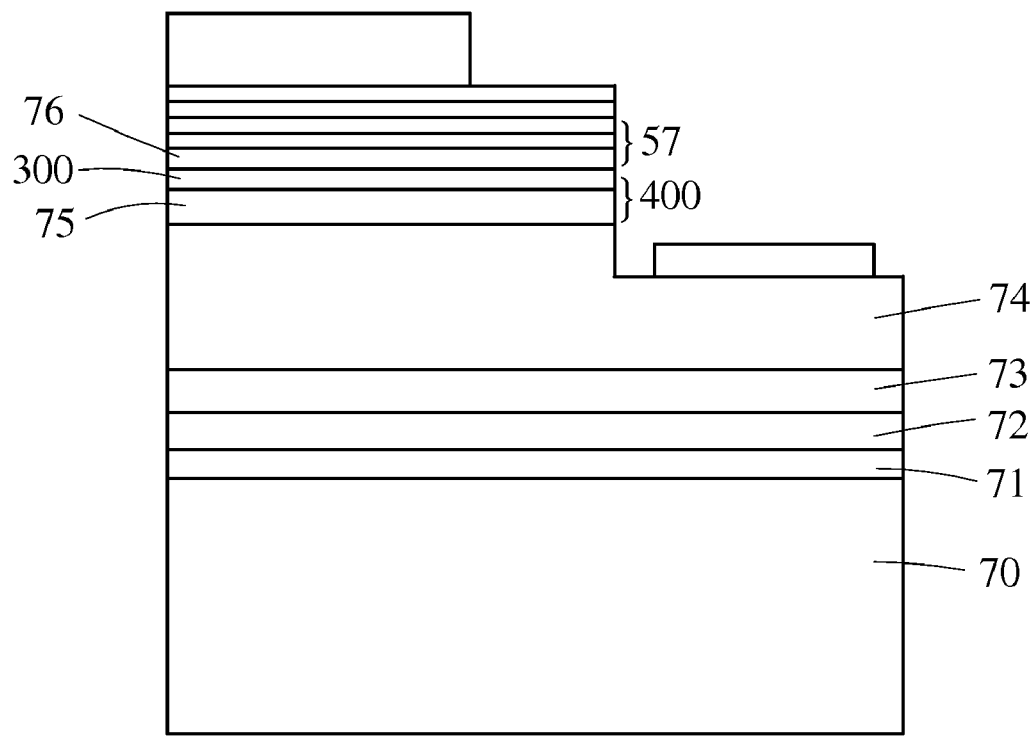
FIG. 7 is a structural schematic view of a preferred embodiment of the LED according to the present invention.
Figure 8:
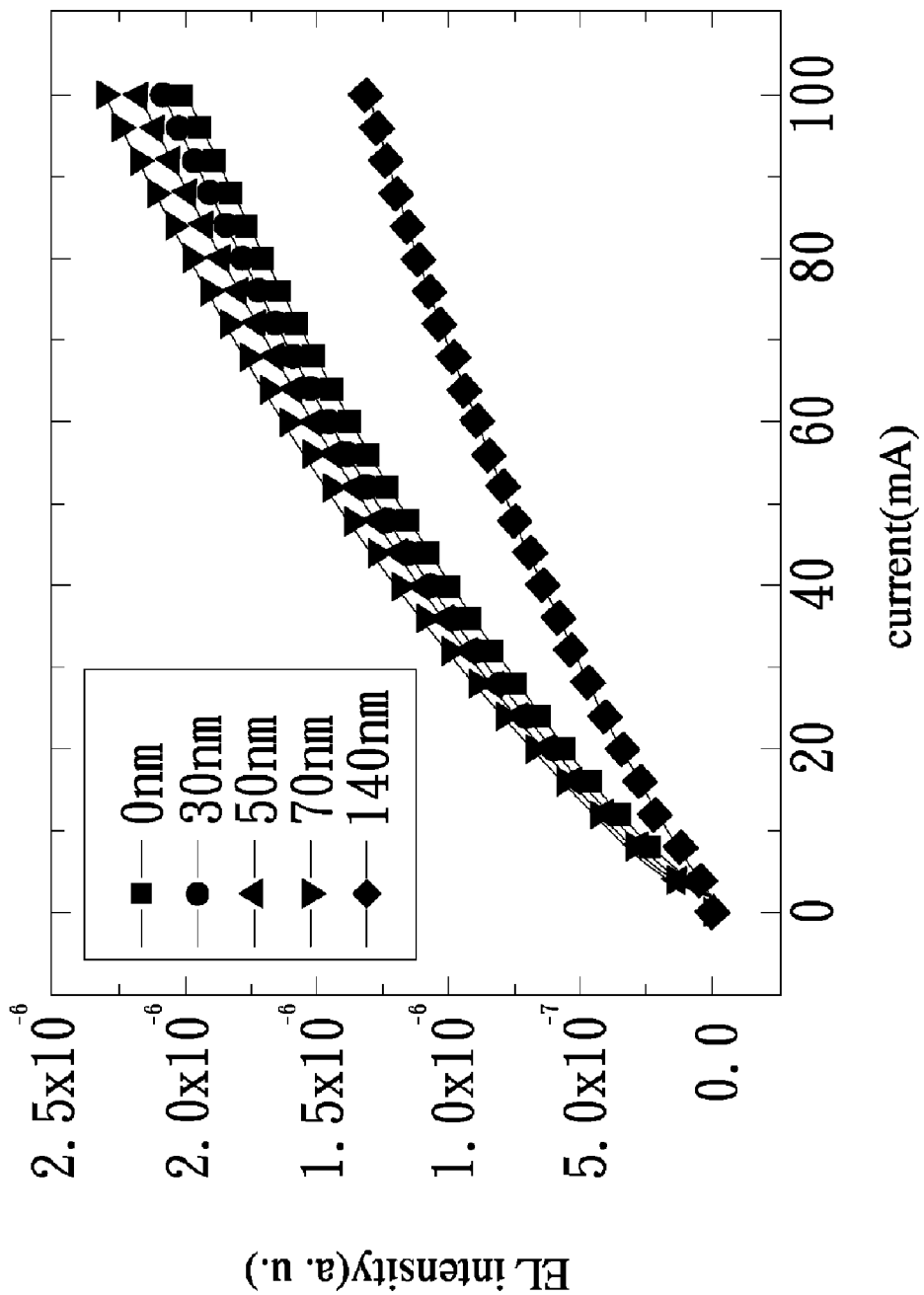
FIG. 8 is an EL intensity trend comparison view of the preferred embodiments according to the present invention.

Referring now to FIG. 7, a cross-section schematic view of another preferred embodiment of an LED structure according to the present invention is illustrated. The LED structure mainly depends on the embodiment shown in FIG. 6, but a modification of another preferred embodiment of the present invention. According to prior art, in general, if the GaN series LED structure is grown by the MOCVD method, the so-called high temperature growth layer means that the temperature of the growth reaction chamber ranges from 980 to 1050° C.; when the InGaN light-emitting layer structure is grown, the growth temperature of the reaction chamber must be reduced to a range of 700 to 835° C. to control the indium atoms combination in the light-emitting layer for obtaining the LED element emitting in blue-green wavelength range. In view of this, if the temperature of the growth reaction chamber is reduced from 980~1050° C. to 700~835° C., the growth interface following the InGaN light-emitting layer will produce additional vacancy bonding, which is not conductive to the follow-up growth of the InGaN light-emitting layer with high quality. Therefore, the embodiment adopts an interface blocking layer to separate the defect produced by the vacancy bonding, so as to get the preferred InGaN/GaN MQW light-emitting layer. The preferred implementation is described as follows:

After a low temperature GaN buffer layer 71 with a thickness of about 250 Å and a non-doped type high temperature GaN layer 72 with a thickness of about 1.2 μm are formed over a substrate 70, epitaxy sequentially forms a superlattice structure layer 73 over the GaN layer 72, wherein the superlattice structure layer 73 is composed of high temperature GaN with an n-type carrier doping concentration of about $6\times10^{+18}$ cm$^{-3}$ and aluminum gallium nitride, then each of the above respectively with a thickness of 20 Å repeats 15 times of overtapping growth, and epitaxy forms an n-type GaN ohmic contact layer 74 over the superlattice structure layer 73, in which the growth thickness and the n-type carrier doping concentration of the n-type GaN ohmic contact layer 74 are about 4 μm and $4\times10^{+18}$ cm$^{-3}$, respectively. Then, the temperature of the growth reaction chamber is reduced from 1030° C. to 835° C., and the preferred range is between 835° C. to 950° C. During the period of lowering the temperature, hydrogen flow is reduced and nitrogen flow is increased at the same time until epitaxy growth environment is completely changed to pure nitrogen; after the flow, pressure, and temperature of the reaction chamber are stable, the epitaxy conditions of the superlattice structure layer 73 are sequentially repeated, but the n-type carrier doping concentration is changed to $1\times10^{+18}$ cm$^{-3}$ to form another superlattice structure layer 75. Then, another n-type doping GaN layer 300 with a different thickness is added to form the so-called interface blocking layer 400, and then an MQW light-emitting layer 76 is composed of an InGaN quantum well without carrier doping and with a thickness of about 25 Å, and a GaN barrier layer with a thickness of about 125 Å. After the growth of the epitaxy of the light-emitting layer is achieved, the epitaxy conditions of the remaining structure maintain the same as shown in FIG. 6. Based on the dice process method disclosed by the above preferred reference case, an LED dice with a dimension of 325 um×325 um is made. The experimental results of the n-type doping GaN layer 300 with a different thickness are shown in FIG. 8. When the thickness is about 700 Å and is applied with DC 20 mA, an EL intensity of about $7.1\times10^{-7}$ is obtained, which is equivalent to an output power of about 6.64 mW with a 20% increase compared with the embodiment shown in FIG. 6.

Figure 9:
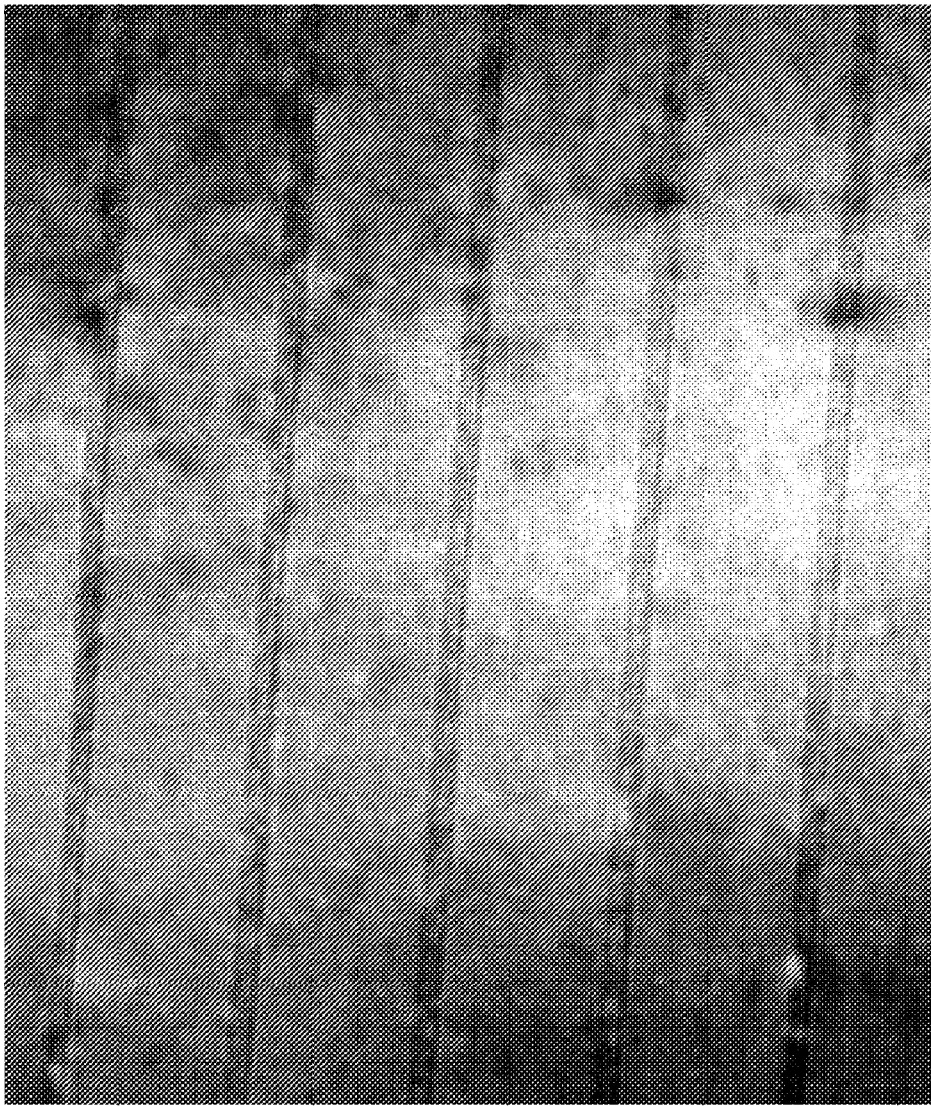
FIG. 9 is a light-emitting layer TEM view of a preferred embodiment according to the present invention.

Referring now to FIG. 9, a cross-section TEM view of MQW light-emitting layer according to the present invention is shown. Because there is no characteristic of thickness periodic change in the present invention, which is different with prior art, and has an inventive step.

What is claimed is:

1. A GaN series LED structure, including:
   a substrate;
   at least one GaN series layer, wherein the GaN series layer is formed over said substrate;
   a light-emitting layer, wherein the light-emitting layer is formed over said GaN series layer;
   a p-type GaN series layer, wherein the p-type GaN series layer is formed over said light-emitting layer; and
   at least one interface blocking layer, wherein the interface blocking layer is formed between said GaN series layer and said light-emitting layer.

2. The GaN series LED structure as claimed in claim 1, wherein the interface blocking layer is composed of an n-type GaN series superlattice structure stacked with an n-type GaN layer.

3. The GaN series LED structure as claimed in claim 2, wherein a thickness of the n-type GaN layer combined in the interface blocking layer is less than 1400 Å.

4. The GaN series LED structure as claimed in claim 3, wherein a range of the thickness of the n-type GaN layer is between 300 Å~1400 Å.

5. The GaN series LED structure as claimed in claim 2, wherein the n-type GaN series superlattice structure combined in the interface blocking layer is composed of a aluminum indium gallium nitride layer mutually stacked with a GaN layer.

6. The GaN series LED structure as claimed in claim 5, wherein a range of the thickness of the n-type GaN series superlattice structure is between 600 Å~800 Å.

7. The GaN series LED structure as claimed in claim 5, wherein a composition proportion of aluminum in the aluminum indium gallium nitride layer of the n-type GaN series superlattice structure is between 5%~10%.

8. The GaN series LED structure as claimed in claim 2, wherein the n-type GaN series superlattice structure further includes an InGaN layer subsequently and mutually stacked with the GaN layer.

9. The GaN series LED structure as claimed in claim 8, wherein a composition proportion of indium in the InGaN layer is less than 10%, and a thickness of the InGaN layer is no more than 15 Å.

10. The GaN series LED structure as claimed in claim 1, wherein an epitaxy growth temperature of the interface blocking layer ranges from 835° C. to 950° C.

11. A GaN series LED structure, including:
    a substrate;
    a GaN series buffer layer, wherein the GaN series buffer layer is formed over said substrate;
    a first n-type GaN series superlattice structure layer, wherein the first n-type GaN series superlattice structure layer is formed over the GaN series buffer layer;
    a first n-type GaN series layer, wherein the first n-type GaN series layer is formed over said first n-type GaN series superlattice structure layer;
    a second n-type GaN series superlattice structure layer, wherein the second n-type GaN series superlattice structure layer is formed over said first n-type GaN series layer;
    a third n-type GaN series layer, wherein the third n-type GaN series layer is formed over said second n-type GaN series superlattice structure layer;

a light-emitting layer, wherein the light-emitting layer is formed over said third n-type GaN series layer; and a p-type GaN series layer, wherein the p-type GaN series layer is formed over said light-emitting layer.

12. The GaN series LED structure as claimed in claim 11, wherein an interface blocking layer is composed of said second n-type GaN series superlattice structure stacked with said third n-type GaN layer.

13. The GaN series LED structure as claimed in claim 11, wherein the p-type GaN series layer is composed of a p-type cladding layer and a p-type ohmic contact layer.

14. The GaN series LED structure as claimed in claim 13, wherein the p-type cladding layer is a superlattice structure composed of a p-type GaN series layer.

* * * * *